United States Patent [19]
Gabriel et al.

[11] Patent Number: 5,214,385
[45] Date of Patent: May 25, 1993

[54] APPARATUS AND METHOD FOR UTILIZING POLARIZATION VOLTAGE TO DETERMINE CHARGE STATE OF A BATTERY

[75] Inventors: Charles M. Gabriel, Lombard; Merlin E. Burkum, Elmhurst, both of Ill.

[73] Assignee: Commonwealth Edison Company, Chicago, Ill.

[21] Appl. No.: 703,893

[22] Filed: May 22, 1991

[51] Int. Cl.⁵ .................. G01N 27/416; A02J 7/00
[52] U.S. Cl. .................... 324/434; 324/426; 320/48
[58] Field of Search ............ 324/426, 427, 430, 433, 324/435, 436, 437; 340/636; 320/43, 44, 48

[56] References Cited
U.S. PATENT DOCUMENTS

| | | | |
|---|---|---|---|
| 4,217,645 | 8/1980 | Barry et al. | 320/48 X |
| 4,394,741 | 7/1983 | Lowndes | 320/48 X |
| 4,423,379 | 12/1983 | Jacobs | 324/429 |
| 4,433,294 | 2/1984 | Windebank | 324/429 |
| 4,697,134 | 9/1987 | Burkum et al. | 320/48 |
| 4,833,459 | 5/1989 | Geuer et al. | 340/636 |
| 4,876,513 | 10/1989 | Brilmyer et al. | 324/427 |
| 4,937,528 | 6/1990 | Palanisamy | 324/430 |

FOREIGN PATENT DOCUMENTS 1454358  11/1976  United Kingdom ............ 324/427

OTHER PUBLICATIONS

Battery Impedance: Farads, Milliohms, Microhenrys, E. Willihganz and Peter Rohner, AIEE Air Transportation Conference Sep. 1959, pp. 259-262.

"*Handbook of Batteries & Fuel Cells*", edited by David Linden, pp. 14-10-14-12.

*Primary Examiner*—Gerard R. Strecker
*Assistant Examiner*—Diep Do
*Attorney, Agent, or Firm*—Willian, Brinks, Olds, Hofer, Gilson & Lione

[57] ABSTRACT

An apparatus for measuring charge state of a battery having multiple cells includes a transmitter that is connected to the battery to apply a test signal across the battery. This test signal is preferably a continuous square wave signal having a frequency less than 3 Hz. The test signal alternates between a voltage adequate to charge the battery and a lower voltage, and the charging voltage is retained for a time sufficient to allow a polarization voltage to develop across individual cells. A receiver is connected to the cell to monitor the polarization voltage across a cell as it develops in response to the test signal. This polarization voltage can be monitored for example using a DC voltmeter, or by displaying the voltage versus time waveform. In either case an accurate indication of the state of the charge of the cell is provided.

34 Claims, 4 Drawing Sheets

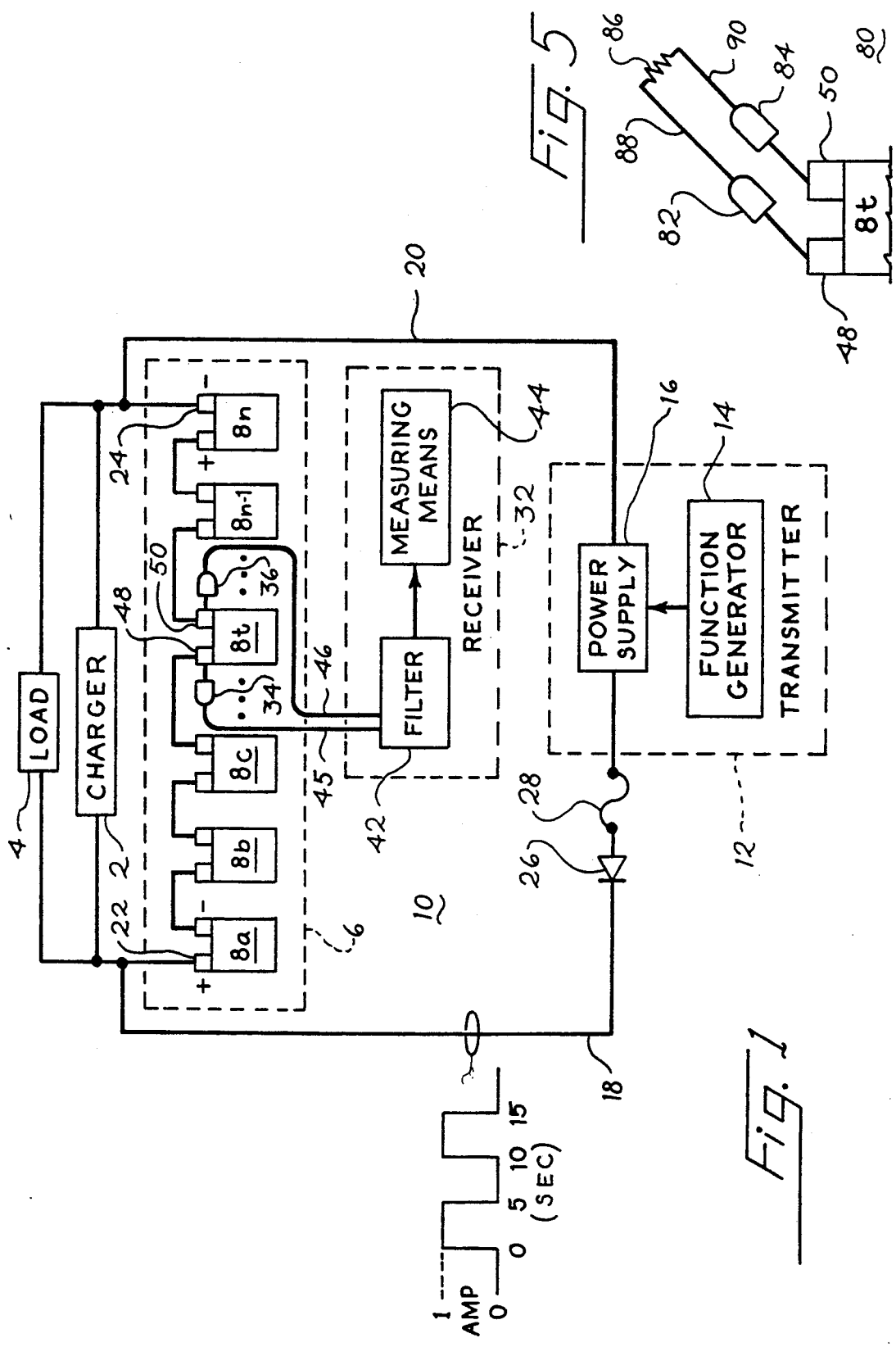

FULLY CHARGED CELL (0.1 Hz)

CHARGING CELL (0.1 Hz)

DISCHARGING CELL (0.1 Hz)

FULLY CHARGED
CELL
(0.1 Hz)

CHARGING
CELL
(0.1 Hz)

DISCHARGING
CELL
(0.1 Hz)

FULLY CHARGED CELL (1 Hz)

CHARGING CELL (1 Hz)

DISCHARGING CELL (1 Hz)

APPARATUS AND METHOD FOR UTILIZING POLARIZATION VOLTAGE TO DETERMINE CHARGE STATE OF A BATTERY

BACKGROUND OF INVENTION

This invention relates to devices and methods for determining whether or not a battery is fully charged.

Batteries have numerous applications. Some batteries are used in electrical generating stations, electrical switching stations and other such applications to provide backup power. Commercial and industrial facilities use batteries to power emergency systems in the event normal AC power is interrupted. Electric vehicles using batteries are presently being developed by automobile manufacturers. In all these and many other applications, it is often important to know whether or not a battery has reached a fully charged state. It also is important to detect shorted cells early.

One existing method for determining the charge state of a battery relies on the use of a hydrometer. However, such a reading may be inconvenient and may not indicate a full charge until weeks after the battery is in fact fully charged. Other methods measure battery open circuit voltage to determine whether a battery is fully charged. Such methods, such as the ones described in U.S. Pat. No. 4,937,528 to Palanisamy and U.S. Pat. No. 4,423,379 to Jacobs, et. al. specifically require dissipation of the polarization voltage before measuring open circuit voltage for full charge. However, open circuit voltage varies with load, and such methods may be inaccurate if a load is connected to the battery during the measurement. Existing methods such as disclosed by Palanisamy in U.S. Pat. No. 4,937,528 rely on low open circuit voltage and/or inflections in a dV/dI curve to detect a shorted cell. However, open circuit voltage is not always a reliable early indicator of a shorted cell.

Shorted cells also are difficult to detect early. It has been observed that shorted cells initially have high resistance shorts (on the order of 1 ohm). Because battery resistance is small (on the order of 0.1 to 10 milliohms) a change in battery resistance due to this "parallel" short is difficult to detect by existing means, for example, using the battery monitor described in U.S. Pat. No. 4,697,134 to Burkum and Gabriel. It is only when the battery is shorted with a low resistance short and can not be charged that a shorted cell becomes evident. However, in many applications it is important to detect a shorted cell prior to this point.

Contrary to some previous methods, observation of the polarization voltage can indicate that a battery or individual cells of a battery are fully charged. Likewise, absence of the polarization voltage in a cell where polarization voltage is present in other cells in the battery can indicate that the cell is less than fully charged and therefore shorted. The polarization voltage is a counter electromotive force caused by a change in the density of the electrolyte in the pores of the battery plates. During charging the polarization voltage increases and eventually stabilizes, at which time the battery is fully charged and gassing. This can occur several weeks before a hydrometer test would indicate that a battery is fully charged. It may be many hours before the polarization voltage stabilizes.

An apparatus that could quickly and easily detect the stabilized polarization voltage would be extremely beneficial. Under certain circumstances, such an apparatus also could indicate the presence of a shorted cell. It also would be valuable to perform this test without disconnecting the battery from its electrical load.

It is therefore an object of this invention to determine when an individual cell of a battery has reached full charge.

It is another object of this invention to determine whether an individual cell of a battery is shorted.

It is a further object of this invention to determine if a cell of a battery connected to a battery charger and an electrical load is fully charged.

It is another object of this invention to determine if a cell of a battery connected to a battery charger and an electrical load is shorted.

It is a further object of this invention to determine when the polarization voltage of a battery has stabilized.

SUMMARY OF INVENTION

According to this invention, an apparatus is provided for measuring charge state of a battery that comprises at least one cell. This apparatus comprises a transmitter connected to the battery and operative to apply a test signal to the cell. The test signal is characterized by at least one transition to a charging voltage which is retained for a time sufficient to allow a polarization voltage to develop across the cell. A receiver is connected to the cell and operates to monitor the polarization voltage across the cell to provide an indication of the state of charge of the cell.

According to the method of this invention the charge state of a battery comprising at least one cell is determined by (i) applying a test signal across the cell, wherein the test signal is characterized by at least one transition to a charging voltage which is retained for a time sufficient to allow a polarization voltage to develop across the cell, and (2) monitoring the polarization voltage across the cell to provide an indication of the state of charge of the cell.

As pointed out below, in the preferred embodiment the test signal is a continuous square wave having a frequency which is preferably less than 3.0 Hz and most preferably between 0.1 and 1.0 Hz. The test signal allows the development of the polarization voltage to be monitored simply and rapidly.

This invention is particularly useful for determining whether or not a cell is fully charged while the battery is connected both to an active electrical load and to a battery charger. A battery may be tested using the apparatus and method described below and still be available immediately for emergency service.

BRIEF DESCRIPTION OF THE DRAWINGS

FIG. 1 is a schematic circuit diagram of the presently preferred embodiment of an apparatus for detecting the charge state of a battery cell.

FIG. 5 is a schematic circuit diagram of a discharge resistor circuit for discharging the polarization voltage.

DETAILED DESCRIPTION OF THE PREFERRED EMBODIMENTS

Figure 2A:
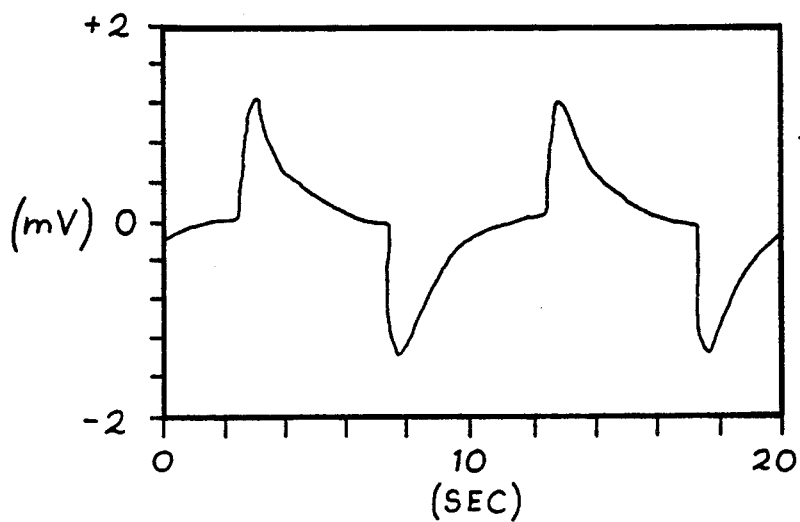
FIGS. 2a, 2b and 2c are polarization voltage vs. time waveforms measured with the apparatus 10 across a 2.2 volt battery cell that was fully charged (FIG. 2a), partially charged and charging (FIG. 2b), and partially charged and discharging (FIG. 2c) while a 1 amp, 0.1 Hz test signal was applied to the cell.

Referring to FIG. 1, the preferred embodiment of an apparatus 10 for determining the state of charge of a battery cell is used to test a battery 6, comprising a plurality of cells 8a ... 8n while the battery 6 is connected to an active electrical load 4 and a battery charger 2. Typical operation and characteristics of the charger 2 and electrical load 4 are discussed in U.S. Pat. No. 4,697,134 to Burkum and Gabriel, col. 5, lines 38-55, which is incorporated herein by reference.

The preferred embodiment of the apparatus 10 comprises a transmitter 12 and a receiver 32. The transmitter 12 injects a periodic current of a selected frequency as a test signal. In the preferred embodiment, transmitter 12 includes a function generator 14 which is capable of generating a square wave in a frequency range of 0.001 Hz to 3.0 Hz. The function generator 14 drives a power supply 16 to cause the power supply to inject a square wave of current at the desired magnitude and at the desired frequency. The function generator 14 is connected to the power supply 16 using standard connections for the power supply to act as a current generator. The power supply 16 is powered by an AC supply source (not shown) and is adjustable to vary the injected current to the desired value. The output of the power supply 16 is connected to the positive and negative terminals 22, 24 of the battery 6 with leads 18, 20, respectively. A diode 26 and a fuse 28 are installed in the lead 18. The diode 26 prevents current from flowing from the battery 6 back towards the power supply 16, protecting the power supply. Current will only flow when the output voltage of the power supply 16 exceeds the output voltage of the battery 6. The fuse 28 protects the power supply 16 in the event the leads 19, 20 are reversed (connecting the lead 18 to the negative terminal 24 and the lead 20 to the positive terminal 22).

The receiver 32 is connected across the battery terminals 48, 50 of the cell 8t to be tested with probes 34, 36. The probes 34, 36 are preferably probes having spring-loaded contact points which twist as they are pushed against the battery terminals. Such probes result in a low resistance probe contact. The probes 34, 36 are connected to a filter 42 with leads 45, 46. The filter 42 attenuates or blocks the DC voltage output from the cell 8t and passes a filtered voltage signal having a frequency corresponding to that of the test signal injected by the transmitter 12. Thus, in the preferred embodiment, the filter 42 acts as a high pass filter, blocking the DC voltage yet passing a 0.1 Hz voltage signal. A measuring means 44 is connected to the filter 42 to measure the filtered voltage signal. The filtered voltage signal varies with polarization voltage of the cell 8t, and can be used as described below to determine whether or not the cell 8t is fully charged.

In the preferred embodiment, the measuring means 44 includes a high impedance DC voltmeter which measures peak-to-peak voltage of the filtered voltage signal. Based on prior experience and instrument calibration, the operator of the apparatus 10 can determine whether the cell 8t is fully charged or not by observing the peak-to-peak voltage as measured by the DC voltmeter. Because of the low frequency (0.1 Hz) used in the preferred embodiment, a DC voltmeter is particularly effective for this application. The long period of the filtered voltage signal allows the DC voltmeter to respond to each half cycle, reading the positive and negative peaks. The voltmeter should not respond to higher frequency components (above 5 Hz), thus eliminating the need for additional high frequency attenuation filters to be added to the filter 42.

Alternatively, a comparator circuit with a light emitting diode (not shown) may serve in place of a high impedance voltmeter. A reference voltage is selected depending upon the type of battery being tested. The LED is illuminated when the battery voltage exceeds the reference voltage, indicating a fully charged battery.

In an alternative embodiment, the measuring means 44 may include a visual display such as an oscilloscope, a spectrum analyzer, an X-Y plotter, a computer or an equivalent device. A spectrum analyzer is preferred. Use of a visual display measuring means allows a person using the apparatus 10 to view the voltage vs. time waveform of the cell 8t and to determine by observing the shape of the waveform whether or not the cell is fully charged. The peak-to-peak voltage also is observable on the visual display measuring means, although a different value will be indicated than when using a DC voltmeter. The shape of the waveform also may indicate if the cell 8t is shorted.

In general, the measuring means 44 should be sensitive to voltage changes of a few millivolts in order to monitor development of the polarization voltage associated with the test signal. Because the polarization voltage for batteries such as lead-acid batteries will typically be millivolt signals superimposed on multiple volt DC signals, it will often be helpful to block the DC signal as described above. A filter as described above may not be required in all embodiments, and it may be preferable for some applications to compensate for the DC signal with a suitable offset voltage, or to use a high resolution measuring means.

Figure 2B:
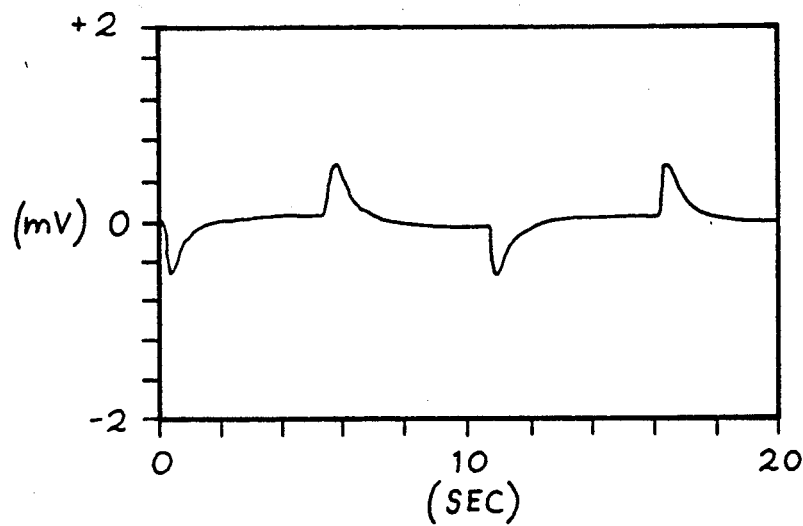
Figure 2C:
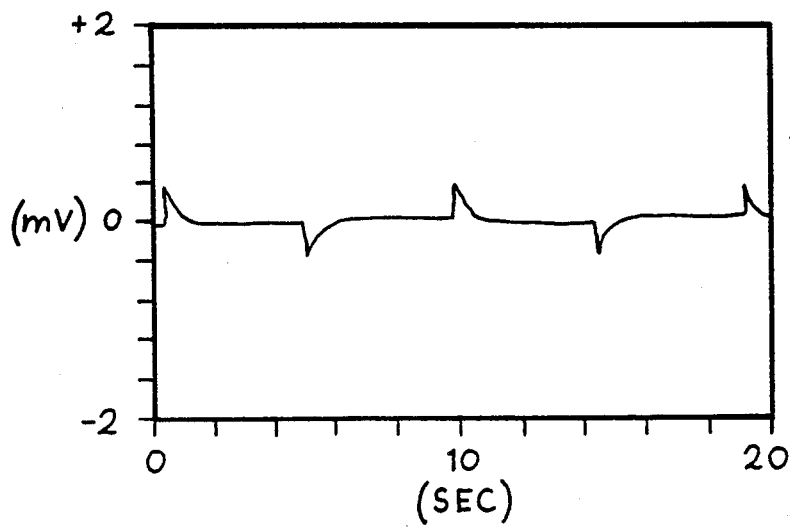
Figure 3A:
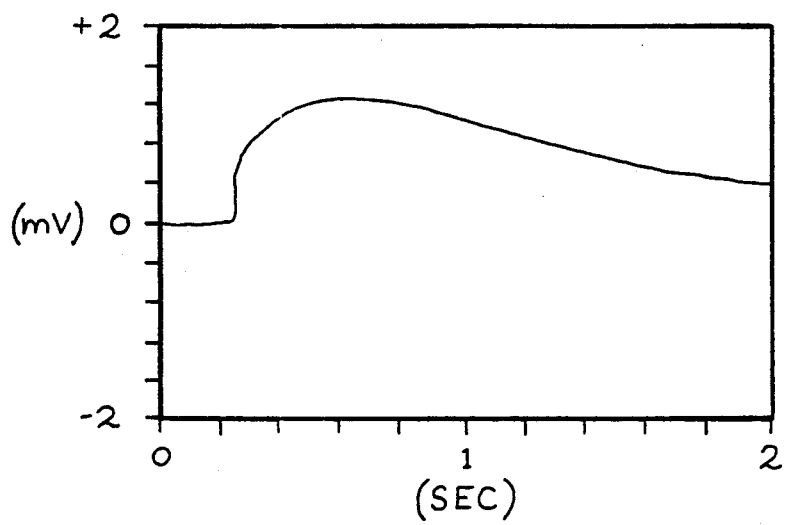
FIGS. 3a, 3b, 3c are polarization voltage vs. time waveforms corresponding to FIGS. 2a, 2b, 2c, respectively, displayed with an expanded time scale.
Figure 3B:
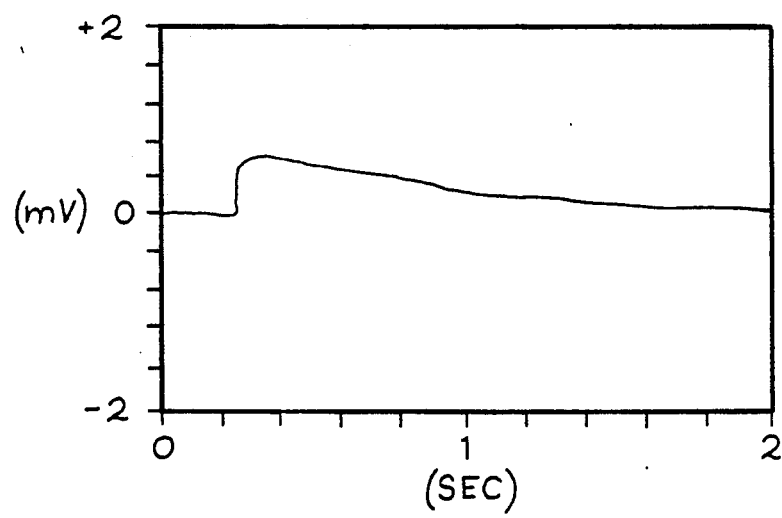
Figure 3C:
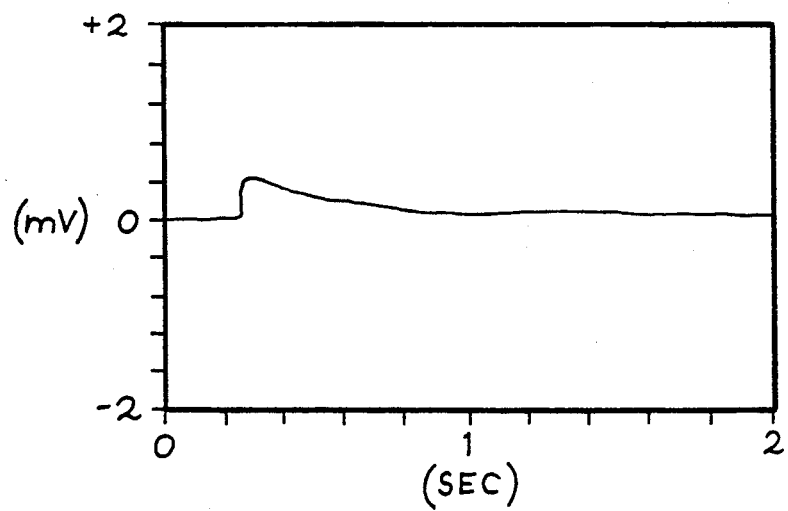
Figure 4A:
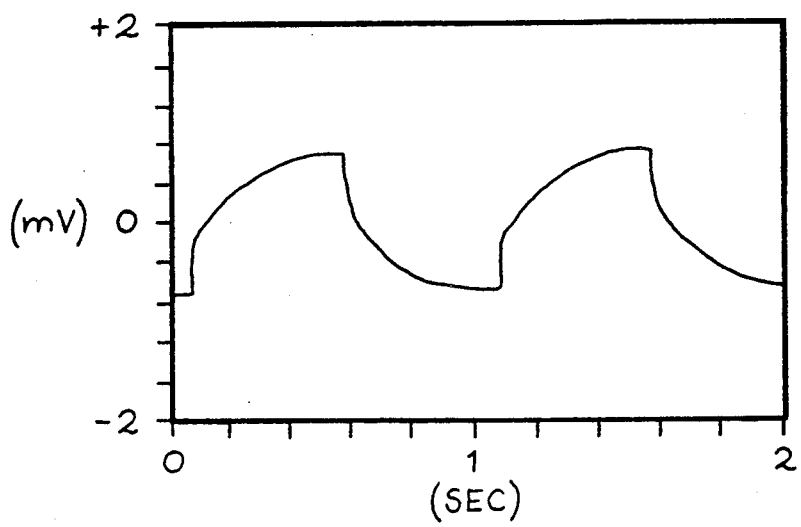
FIGS. 4a, 4b, 4c are polarization voltage vs. time waveforms measured with the apparatus 10 across a 2.2 volt battery cell that was fully charged and partially charged and charging (FIG. 4b) and partially charged and sicharging (FIG. 4c) while a 1 amp, 1.0 Hz test signal was applied to the cell.
Figure 4B:
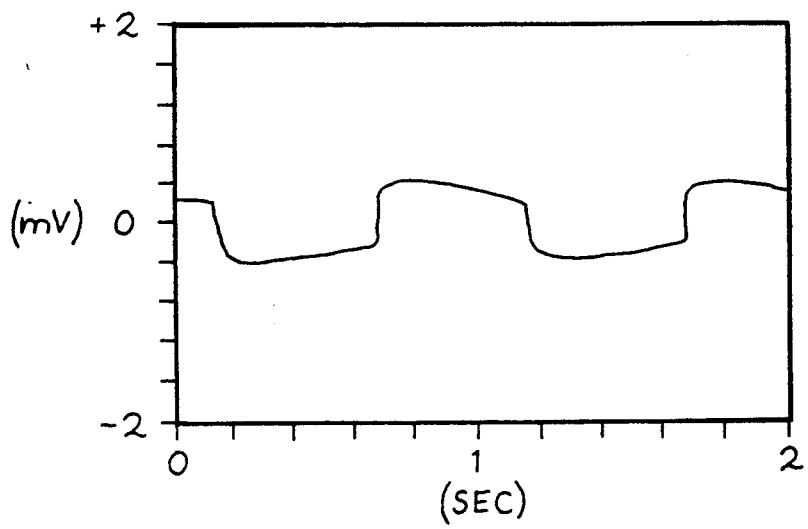
Figure 4C:
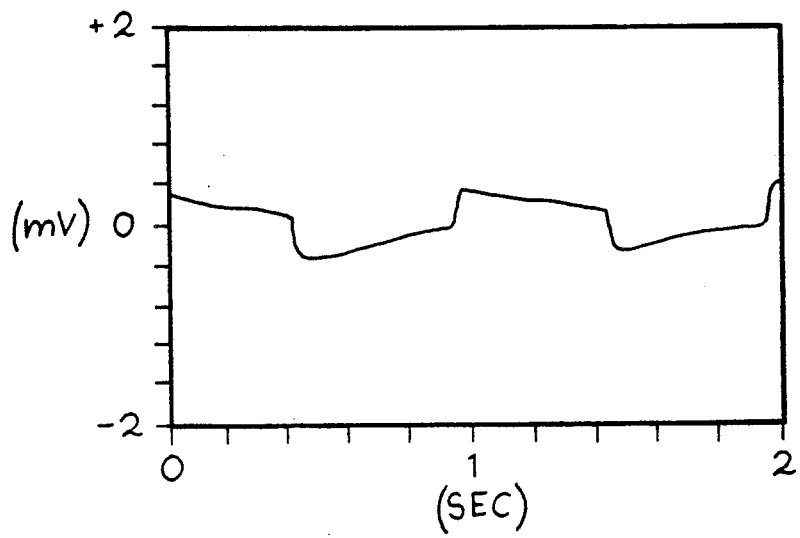

FIGS. 2a-4c will be used to explain the manner in which the apparatus 10 can be used to distinguish a fully charged cell from a partially discharged cell. In FIGS. 2a, 2b, 3a, 3b, 4a and 4b the cell under test is being charged. In FIGS. 2c, 3c and 4c the cell under test is discharging while connected to a 100 amp load. In all cases the illustrated waveforms are of the filtered voltage signal supplied by the filter 42 as displayed on a spectrum analyzer in the oscilloscope mode.

FIGS. 2a, 2b and 2c show that the voltage vs. time waveform for a fully charged cell (FIG. 2a) is substantially different from the corresponding waveform for a partially charged cell, whether charging (FIG. 2b) or discharging (FIG. 2c). Similarly, the peak-to-peak voltage excursion for the fully charged cell (FIG. 2a) is greater than that for a partially charged cell (FIGS. 2b and 2c).

FIGS. 3a, 3b and 3c correspond to FIGS. 2a, 2b, 2c, respectively, at an expanded time scale, and FIGS. 3a, 3b and 3c also show differences in waveform and voltage magnitude between the fully charged cell (FIG. 3a) and the partially charged cells (FIGS. 3b and 3c).

FIGS. 4a, 4b and 4c are similar to FIGS. 3a, 3b, 3c, respectively, except that a test signal having a higher frequency of 1 Hz was used for FIGS. 4a, 4b, 4c. As before, the waveforms and the voltage magnitudes are quite different for a fully charged cell (FIG. 4a) as compared with a partially charged cell (FIGS. 4b and 4c).

In the presently preferred embodiment, the function generator 14 is a Wavetech (San Diego, CA) Model 20 Function Generator. This function generator is set in the continuous mode to produce a continuous square wave have a 1 volt peak and a 0 volt minimum voltage, resulting in an average DC output of 0.5 Volt over a full period. The frequency is adjusted to 0.1 Hz in the preferred embodiment to allow time for the polarization voltage to develop, although it may be advantageous to set the frequency at 1.0 Hz if a visual display is used for the measuring means 44. A square wave also allows a large portion of the initial injected current to go through the battery 6, rather than through the load 4 or the charger 2. At a frequency of 0.1 Hz, the ratio of the peak-to-peak voltage for a fully charged cell to the peak-to-peak voltage for a charging or discharging cell is relatively large. This ratio can be seen in Tables 1 and 2 as discussed below. In general, it is anticipated that frequencies from 3.0 Hz to 0.001 Hz or less will be useful with this invention when applied to a lead-acid battery. If the frequency is above 3.0 Hz, it is difficult to detect the polarization voltage of such batteries. Lower frequencies (below the 0.1 Hz preferred frequency) give good results but require more expensive filtering to attenuate the DC signal while passing the low frequency component of the battery voltage.

The power supply 16 is preferably a Kepco (Flushing, NY) Model ATE 150-3.5 M. This power supply has an output range of 0-150 VDC and 0-3.5 amps DC. The output of the function generator 14 is connected to the terminals of the rear programming connector PC-12 to program the power supply to operate as a current generator. As shown in FIG. 1 the output current is adjusted to approximately 1 amp peak on the current square wave (0.5 amp DC over the entire period) using the power supply's current control. The fuse 28 is preferably rated at 3-10 amps, 250 V. The diode 26 is preferably type SK3051, RCA8726, rated at 1000 Volts reverse voltage, 3 amps RMS.

The filter 42 is preferably a Stanford Research (Sunnyvale, Calif.) Model SR560 Low-Noise Preamplifier. In the preferred embodiment, this device is operated in the AC coupling mode. This mode automatically engages a 0.03 Hz cutoff high-pass filter which blocks the DC terminal voltage of the battery cell 8t. No other filters need be used. The gain mode is set to "Low Noise" and the gain of the filter is set to 1.0 in the preferred mode. If a battery with a charger of vastly different characteristics is used, a higher gain may be required to drive the measuring means 44. Use of the 600 ohm output is preferred.

In the preferred embodiment, a DC voltmeter is used as the measuring means 44. A Fluke (Everett, WA) Model 845AB High Impedance Voltmeter is preferred. For testing 2.2 Volt lead-acid batteries, a 10 mV full scale is preferred for this measuring means. In the alternate embodiment that utilizes a visual display, an Ono Sokki (Tokyo, Japan) Model CF-940 Spectrum Analyzer is preferred. A 2 mV full scale is preferred.

The apparatus 10 allows a quick and accurate determination of whether a cell in the battery 6 is fully charged, or less than fully charged. The preferred method for determining the charge state of the cell 8t in the battery 6 is to attach the leads 18, 20 from the transmitter 12 to the positive and negative terminals 22, 24, respectively, of the battery 6. This test is preferably performed while the battery 6 is receiving a charge from battery charger 2 and may be performed while the battery 6 is connected to the active electrical load 4. The battery 6 has preferably been charging for several days prior to testing. The transmitter 12 is adjusted to output a current square wave with a peak of 1 amp (0.5 amp average current over the entire period). As mentioned previously, a frequency of 0.1 Hz is preferred although 1.0 Hz may be convenient if a visual display measuring means 44 is used. The probes 34, 36 are connected to the positive and negative terminals 48, 50, respectively, of the cell 8t to be tested. The filter 42 is adjusted to block the DC output of the cell 8t and to pass to 0.1 Hz (or other frequency) test signal. No filtering of higher frequency components is necessary in the preferred embodiment.

Using the preferred embodiment of a DC voltmeter as the measuring means 44, the operator records the peak-to-peak voltage of the DC voltmeter by noting the high to low swing. In general, a higher reading (above an appropriate threshold for the cell under test) is indicative of a fully charged cell. With experience and after careful calibration, the operator will be able to determine if a cell is fully charged from the voltmeter reading. Table 1 lists peak-to-peak voltage measurements of several fully charged cells (Column 3) and partially charged cells (Column 4).

TABLE 1

| TEST SIGNAL FREQUENCY | MEASURING MEANS | PEAK-TO-PEAK VOLTAGE (FULLY CHARGED CELL) | PEAK-TO-PEAK VOLTAGE (PARTIALLY CHARGED CELL) | RATIO |
|---|---|---|---|---|
| 0.1 Hz | DCVM | 6.6 mv | 0.4 mv | 16.5 |
|  | VD | 2.6 mv | 0.9 mv | 2.8 |
| 0.1 Hz | DCVM | 5.3 mv | 0.5 mv | 10.6 |
|  | VD | 2.1 mv | 0.8 mv | 2.8 |
| 1.0 Hz | DCVM | 0.1 mv | 0.025 mv | 4.0 |
|  | VD | 1.5 mv | 0.9 mv | 1.7 |

DCVM - DC Voltmeter
VD - Spectrum Analyzer Visual Display

TABLE 2

| TEST SIGNAL FREQUENCY | MEASURING MEANS | PEAK-TO-PEAK VOLTAGE (FULLY CHARGED CELL) | PEAK-TO-PEAK VOLTAGE (PARTIALLY CHARGED CELL) | RATIO |
| --- | --- | --- | --- | --- |
| 0.1 Hz | DCVM | 5.0 mv | 0.2 mv | 22.7 |

Battery Load Connected

There is a large difference between the peak-to-peak voltage of a fully charged cell and that of a partially charged cell. For example, Table 1 shows test measurements using the apparatus 10 on an Exide FMP-11 battery of 415 amp-hour capacity. This battery was being charged but not connected to a load during these tests. When the transmitter 12 injected a 0.1 Hz, 1 amp current square wave test signal, a ratio of peak-to-peak voltages of up to 16.5 was measured using a DC voltmeter as the measuring means 44. Ratios in excess of 20 have been observed in the field as shown in Table 2. A lower ratio is measured for a 1.0 Hz square wave test signal. Hence, the lower frequency (0.1 Hz) is preferred for this application. This method is especially effective if a battery contains a large number of cells. If the battery has been charging for a long period of time, it would be expected that all cells, except those that are shorted, would be fully charged. Of course, use of the apparatus 10 is not limited to such a situation.

After the operator has tested the first cell in the battery and observed the filtered cell voltage, the operator repeats the test at a second cell and continues until all cells are tested. Cells having a measured peak-to-peak polarization voltage above the level calibrated for the type of battery and charger under test are considered fully charged. Substantially lower measurements of the peak-to-peak voltage indicate a less than fully charged (discharging or shorted) cell. If a question arises as to whether the battery is fully charged, a cell may be discharged by a discharge resistor circuit 80 as discussed below.

For the embodiment where a visual display is used as the measuring means 44, the operator observes or records the shape of the polarization voltage vs. time waveform. This waveform is compared to the distinctive shape of the polarization voltage for a fully charged cell as shown in FIGS. 2a, 3a, 4a to determine if the cell is fully charged. It is apparent from the waveshapes of FIGS. 2a, 3a, 4a as compared to FIGS. 2b, 2c, 3b, 3c, 4b, 4c that the polarization voltage waveshape at full charge is distinctive. The waveforms of FIGS. 4a, 4b, 4c were recorded with the transmitter 12 injecting a 1.0 Hz signal for display convenience, but FIGS. 3a, 3b, 3c show a portion of this distinctive waveform when the transmitter 12 is used to inject a 0.1 Hz test signal. Other visual displays could indicate the entire waveform for a 0.1 Hz test signal if required by the operator. Comparing FIGS. 4a and 4b, it is apparent that it is not until full charge that the voltage vs. time waveform achieves its distinctive characteristic. FIG. 4c shows the voltage vs. time waveform of a discharging cell. A shorted cell has a similar characteristic and it is apparent that a skilled operator can easily distinguish between a fully charged cell and a discharging or a shorted cell. Due to different response characteristics of the visual display and the DC voltmeter, a lower ratio of peak-to-peak voltages is recorded with the visual display, as shown in Table 1. The relative ratios between the visual display and the DC voltmeter will, of course, depend on the actual equipment used.

FIG. 5 shows a schematic diagram of a discharge resistor circuit 80 which includes probes 82, 84 that may be connected to the positive and negative terminals 48, 50 of the cell 8t being tested. The probes 82, 84 are connected to a discharge resistor 86 through leads 88, 90. The discharge resistor 86 is preferably a 20 milliohm, 200 watt resistor. Immediately upon connection of the discharge resistor circuit 80, any polarization voltage collapses, and the peak-to-peak voltage measured on a DC voltmeter falls immediately. Similarly, the voltage vs. time waveform shown in FIG. 2a, 3a collapses to the waveform shown in FIG. 2c, 3c, respectively. If the cell 8t is shorted, very little or no change is evident upon connection of the discharge resistor circuit 80.

For example, the operator may measure the peak-to-peak voltage of each cell and record this voltage. The operator then chooses a cell with a high reading and applies the discharge resistor circuit 80. The operator compares the prior readings to the reading of this one cell on discharge. For the preferred apparatus and method described above using a DC voltmeter, ratios of 10 and above indicate that the cell was initially fully charged, as listed in Table 1. Ratios of approximately 1 indicate a partially discharged (shorted or discharging) cell. Further, if the operator has an indication that a cell may be shorted due to below normal DC voltage (below 2.1 V for a 2.2 V cell), this apparatus and method can quickly confirm that the cell is shorted. Of course, use of this apparatus and method on other types of batteries may result in different ratios indicating a fully charged cell, but the concept will not change.

The examples described above were adapted for testing 2.2 V lead-acid cells. The actual division of current injected by the transmitter 12 will vary with the type of battery, the charger type and load characteristics, if any. For the batteries and cells tested, a sufficient amount of the test signal passed through the battery so that the filtered battery output voltage did not need to be amplified. This may not always be the case in other applications.

Thus, the embodiments described in the specification and drawings are intended to be illustrative rather than limiting. The following claims, including all equivalents, are intended to define the scope of this invention.

We claim:

1. An apparatus for measuring charge state of a battery comprising at least one cell which exhibits a polarization voltage when fully charged, said apparatus comprising:

a transmitter connected to the battery and operative to apply a charging test signal to the cell when the cell is fully charged, said test signal characterized by at least one transition to a voltage value greater than the voltage of the cell to provide charging signal which is retained for a time sufficient to modify the polarization voltage when present across the cell; and a receiver connected to the cell and operative to monitor the polarization voltage across the cell to provide an indication of the state of charge of the cell.

2. The apparatus of claim 1 wherein the test signal is repetitive and is characterized by a periodic series of the transitions.

3. The apparatus of claim 2 wherein the test signal comprises a square wave having a frequency less than about 3 Hz.

4. The apparatus of claim 3 wherein the frequency is no greater than about 1 Hz.

5. The apparatus of claim i wherein the battery is connected to a battery charger and a load, and wherein the battery is being charged by the battery charger.

6. The apparatus of claim 1 wherein the receiver comprises a DC voltmeter, and wherein the indication comprises a measure of the polarization voltage.

7. The apparatus of claim 6 wherein the receiver further comprises:
means for receiving a first voltage signal from the cell; and
a filter operative to attenuate DC components of the first voltage signal and to supply a filtered voltage signal to the DC voltmeter.

8. The apparatus of claim 1 wherein the receiver comprises a display, and wherein the indication comprises a waveform of the polarization voltage.

9. An apparatus for determining charge state of a battery comprising a first positive terminal and a first negative terminal, said battery comprising a cell comprising a second positive terminal and a second negative terminal, said battery connected to and being charged by a battery charger, said apparatus comprising:
a. transmitter means connected to said first positive terminal and first negative terminal for applying thereto a square wave charging current signal at a selected frequency below about 3 Hz;
b. receiver means connected to said second positive terminal and said second negative terminal for receiving a first voltage signal from said cell, said receiver means comprising:
filter means for attenuating DC components of said first voltage signal and outputting a filtered second voltage signal; and
measuring means connected to said filter means for measuring a characteristic of said second voltage signal, which varies with a polarization voltage of the cell to provide an indication of the charge state of said cell.

10. The apparatus of claim 9 wherein said measuring means comprises a DC voltmeter.

11. The apparatus of claim 9 wherein said measuring means comprises a visual display means for displaying a voltage vs. time waveform of said second voltage signal.

12. The apparatus of claim 9 wherein said selected frequency is in the range of about 0.1-1.0 Hz.

13. The apparatus of claim 9 further comprising means for blocking current flow from said battery and battery charger to said transmitter means.

14. The apparatus of claim 9 wherein said battery is connected to an active electrical load.

15. A method for determining charge state of a battery comprising at least one cell which exhibits a polarization voltage when fully charged, said method comprising the following steps:
a. applying a charging test signal across the cell when the cell is fully charged, said test signal characterized by at least one transition to a voltage value greater than the voltage of the cell to provide a charging signal which is retained for a time sufficient to modify the polarization voltage when present across the cell; and
b. monitoring the polarization voltage across the cell to provide an indication of the state of charge of the cell.

16. The method of claim 15 wherein step (b) comprises the step of measuring magnitude of the polarization voltage.

17. The method of claim 15 wherein step (b) comprises the step of observing a waveform of the polarization voltage versus time.

18. The method of claim 15 comprising the following additional steps:
c. discharging said cell after step (b);
d. applying the test signal across the cell after the start of step (c);
e. monitoring the polarization voltage across the cell after the start of step (d) to provide a second indication of the state of charge of the cell; and
f. comparing the indications of steps (b) and (e).

19. The method of claim 16 comprising the following additional steps:
c. discharging said cell after step (b);
d. applying the test signal across the cell after the start of step (c);
e. measuring the magnitude of the polarization voltage after the start of step (d); and
f. comparing the magnitudes of steps (b) and (e).

20. The method of claim 17 comprising the following additional steps:
c. discharging said cell after step (b);
d. applying the test signal across the cell after the start of step (c);
e. observing a waveform of the polarization voltage versus time after the start of step (d); and
f. comparing the waveforms of steps (b) and (e).

21. The method of claim 15 wherein the test signal is repetitive and is characterized by a periodic series of the transitions.

22. The method of claim 21 wherein the test signal comprises a square wave having a frequency less than about 3 Hz.

23. The method of claim 22 wherein the frequency is no greater than about 1 Hz.

24. A method for determining charge state of a battery comprising a first positive terminal and a first negative terminal, said battery comprising a cell comprising a second positive terminal and a second negative terminal, said battery connected to and being charged by a battery charger, said method comprising the following steps:
a. applying a square wave charging current signal at a selected frequency less than about 3 Hz to said first positive terminal and said first negative terminal;
b. obtaining a first voltage signal indicative of cell voltage between said second positive terminal and said second negative terminal;
c. passing said first voltage signal through a filter, said filter selected to attenuate DC components of said first voltage signal and to output a filtered second voltage signal; and d. measuring a characteristic of said second voltage signal which varies with a polarization voltage of the cell to determine the charge state of said cell.

25. The method of claim 24 wherein said characteristic of said second voltage signal is measured by observing a first peak-to-peak voltage on a DC voltmeter.

26. The method of claim 25 comprising the additional step of comparing said first peak-to-peak voltage to a pre-set standard for said battery.

27. The method of claim 24 wherein said characteristic of said second voltage signal is measured as a first voltage vs. time waveform.

28. The method of claim 27 comprising the additional step of comparing said first voltage vs. time waveform to a known waveform indicating full charge.

29. The method of claim 25 comprising the additional steps of discharging said cell using a discharge resistor; measuring a second peak-to-peak voltage of said cell following discharge; and comparing said first peak-to-peak voltage to said second peak-to-peak voltage.

30. The method of claim 29 wherein the comparing step comprises the step of determining a ratio of said first peak-to-peak voltage to said second peak-to-peak voltage, and wherein the method comprises the additional step of comparing said ratio of peak-to-peak voltages to a pre-set standard for said battery; wherein if said ratio exceeds a first preselected value said cell is classified as fully charged and if said ratio is below a second preselected value said cell is classified as shorted.

31. The method of claim 27 comprising the additional steps of discharging said cell using a discharge resistor; observing a second voltage vs. time waveform of said cell following discharge; and observing whether said first voltage vs. time waveform collapses following discharge to determine the charge state of said cell.

32. The method of claim 24 wherein said selected frequency is in the range of 0.1–1.0 Hz.

33. The method of claim 25 wherein said selected frequency is in the range of 0.1–1.0 Hz.

34. The method of claim 26 wherein said selected frequency is in the range of 0.1–1.0 Hz.

* * * * *

UNITED STATES PATENT AND TRADEMARK OFFICE
CERTIFICATE OF CORRECTION

PATENT NO. : 5,214,385
DATED : May 25, 1993
INVENTOR(S) : Charles M. Gabriel, et. al.

It is certified that error appears in the above-indentified patent and that said Letters Patent is hereby corrected as shown below:

```
Column 2, line 33, delete (i) and substitute therefor --(1)--.
Column 2, line 68, before "partially" delete "and" and substitute therefor--
(Fig. 4a),--.
Column 3, line 2, delete "sicharging" and substitute therefor --discharging--.
Column 3, line 41, after "leads" delete "19" and substitute therefor --18--.
Column 8, claim 1, line 9, before "charging" insert --a--.
Column 9, claim 5, line 1, after "claim" delete "i" and substitute therefor--
1--.
```

Signed and Sealed this

Seventh Day of June, 1994

Attest:

BRUCE LEHMAN

*Attesting Officer*   Commissioner of Patents and Trademarks